| United States Patent [19] | [11] Patent Number: 4,862,078 |
| Kawabata | [45] Date of Patent: Aug. 29, 1989 |

[54] CIRCUIT FOR DETECTING DEFECTS OF A MAGNETIC RECORDING HEAD

[75] Inventor: Tomoyuki Kawabata, Hamamatsu, Japan

[73] Assignee: Yamaha Corporation, Hamamatsu, Japan

[21] Appl. No.: 186,153

[22] Filed: Apr. 26, 1988

[30] Foreign Application Priority Data

May 7, 1987 [JP] Japan ................. 62-111375

[51] Int. Cl.⁴ .............................. G01R 33/12
[52] U.S. Cl. .................................... 324/212
[58] Field of Search ................. 324/210–212, 324/59, 150 MG, 546, 547

[56] References Cited

U.S. PATENT DOCUMENTS 4,706,561 11/1987 Greer ................. 324/59 X

FOREIGN PATENT DOCUMENTS 0180820 10/1984 Japan ................. 324/210

OTHER PUBLICATIONS

Gagliano et al., "Magnetic Head Tester", *IBM-TDB*, vol. 6, No. 3, Aug. 1963, pp. 1–3.

*Primary Examiner*—Reinhard J. Eisenzopf
*Assistant Examiner*—Warren S. Edmonds
*Attorney, Agent, or Firm*—Scully, Scott, Murphy & Presser

[57] ABSTRACT

When recording information, a write switching current of a write signal is directed through a coil of a magnetic head, whereby the information corresponding to the write signal is to be recorded on a magnetic recording medium. Hence, a back electromotive voltage is inevitably produced at the coil of the magnetic head. Based on the level of this back electromotive voltage, the quality of the magnetic head can be detected. In this case, by use of a synchronizing circuit, the detected timing of the back electromotive voltage is synchronized with a switching timing of the write switching current. Due to this synchronizing circuit, the back electromotive voltage is detected only at the switching timing of the write switching current, whereby it becomes possible to detect the back electromotive voltage, regardless of noise. Thus, it is possible to detect the quality of the magnetic head with accuracy.

4 Claims, 4 Drawing Sheets

CIRCUIT FOR DETECTING DEFECTS OF A MAGNETIC RECORDING HEAD

BACKGROUND OF THE INVENTION

1. Field of the Invention

The present invention generally relates to a device for detecting defects of a magnetic head or heads, and more particularly to a device by which the quality of the magnetic head is judged based on a level of a back electromotive voltage of the magnetic head due to an inputted write switching current.

2. Prior Art

First, description will be given with respect to a general control circuit of the device for detecting defects of the magnetic heads in conjunction with FIG. 1.

In FIG. 1 a center tap voltage VCT is applied between coils $1a$ and $1b$ of a magnetic head 1, and switching transistors Q1 and Q2 are respectively connected to these coils $1a$ and $1b$. Write signals are supplied to base terminals T1 and T2 of the transistors Q1 and Q2. The levels of these write signals are set inverted each other so that the base terminal T1 will be turned on when the base terminal T2 will be turned off. For example, when the write signal for the base terminal T1 is ON, the transistor Q1 is turned on. Hence, the write switching current due to the center tap voltage VCT flows through a circuit consisting of the coil $1a$, collector and emitter of the transistor Q1 and a constant current source 2. Thus, a magnetic recording is executed on media (i.e., magnetic recording media). Just after a down or lagging edge of the write pulse (i.e., a falling edge of the write switching current), a back electromotive voltage is produced at the coil $1a$. Meanwhile, 3 designates a processing portion of a read signal of the magnetic head 1, and this processing portion 3 is constituted by a differential amplifier. In case of multi-channel heads, the above-mentioned control circuit is provided for each magnetic head, and all control circuits are connected to the constant current source 2.

As shown in FIG. 1, a detecting circuit 4 for detecting defects of the magnetic heads is directly connected to the coils $1a$ and $1b$ via respective diodes D1 and D2. Therefore, the back electromotive voltages produced at the coils $1a$ and $1b$ are normally inputted to the detecting circuit 4. In the normal case, such back electromotive voltage is produced just after the down edge of the write pulse. However, in some cases, the magnetic head 1 breaks down due to breaking of the coils $1a$ and $1b$, hence, the back electromotive voltage is prevented from being produced. In such cases, the detecting circuit 4 outputs a detection signal representing that defects of the magnetic head 1 are detected. As disclosed in Japanese Patent Laid-Open Publication No. 62-38505, the detecting circuit 4 can be constructed by use of a charging circuit and an amplifier circuit. More specifically, a capacitor is charged by intermittently produced back electromotive voltage and the potential of such capacitor is maintained at a level higher than a predetermined level in the normal case. On the other hand, when the back electromotive voltage is not produced so that the potential of the capacitor becomes lower than the predetermined level, the detecting circuit 4 outputs the detection signal. Such detection signal outputted from the detecting circuit 4 is used as a signal for urgently stopping a writing operation of the magnetic head in order to protect recorded information of the magnetic recording medium.

As described above, since the detecting circuit 4 is normally connected with the coils $1a$ and $1b$, the following problem will be incurred.

The detecting circuit 4 must input noise which is absorbed by the magnetic head 1. In order to respond to a high density recording, a thin film head having low impedance is used. However, since such thin film head produces less back electromotive voltage, it is difficult to discriminate the back electromotive voltage and the noise, which causes an error in operation of the detecting circuit 4.

SUMMARY OF THE INVENTION

It is accordingly a primary object of the present invention to provide a device for detecting the defects of the magnetic head or heads which can detect the defects of the magnetic heads with accuracy even if the level of the back electromotive voltage is lowered to the noise level.

In a primary aspect of the invention, there is provided a device for detecting defects of a magnetic head comprising: (a) a synchronizing circuit for synchronizing a detection timing of a back electromotive voltage with a switching timing of a write switching current of the magnetic head, the back electromotive voltage being produced at a coil of the magnetic head due to the write switching current which flows through the coil of the magnetic head; and (b) detecting means for inputting the back electromotive voltage so as to detect the quality of the magnetic head based on level of the inputted back electromotive voltage.

BRIEF DESCRIPTION OF THE DRAWINGS

Further objects and advantages of the present invention will be apparent from the following description, reference being had to the accompanying drawings wherein preferred embodiments of the present invention are clearly shown.

In the drawings.

DESCRIPTION OF THE PREFERRED EMBODIMENTS

Figure 1:
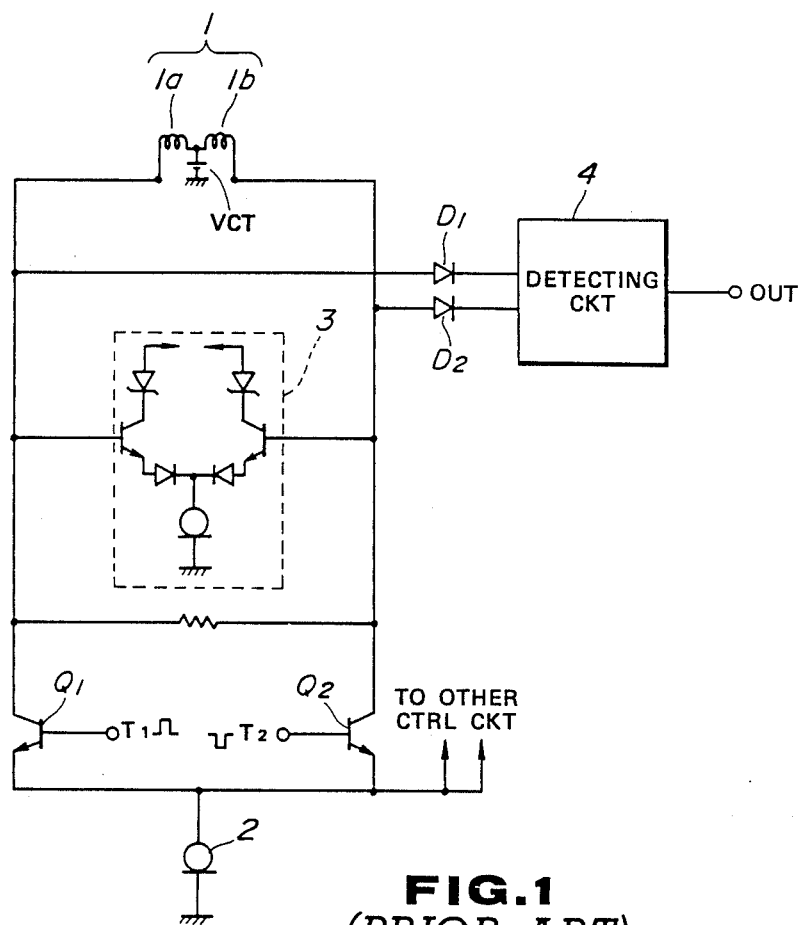
FIG. 1 is a circuit diagram showing an electric constitution of the conventional device for detecting defects of the magnetic heads.

Next, description will be given with respect to embodiments of the present invention in conjunction with FIGS. 2 to 6, wherein like reference characters designate like or corresponding parts throughout FIGS. 1 to 6, hence, detailed description thereof will be omitted.

Figure 2:
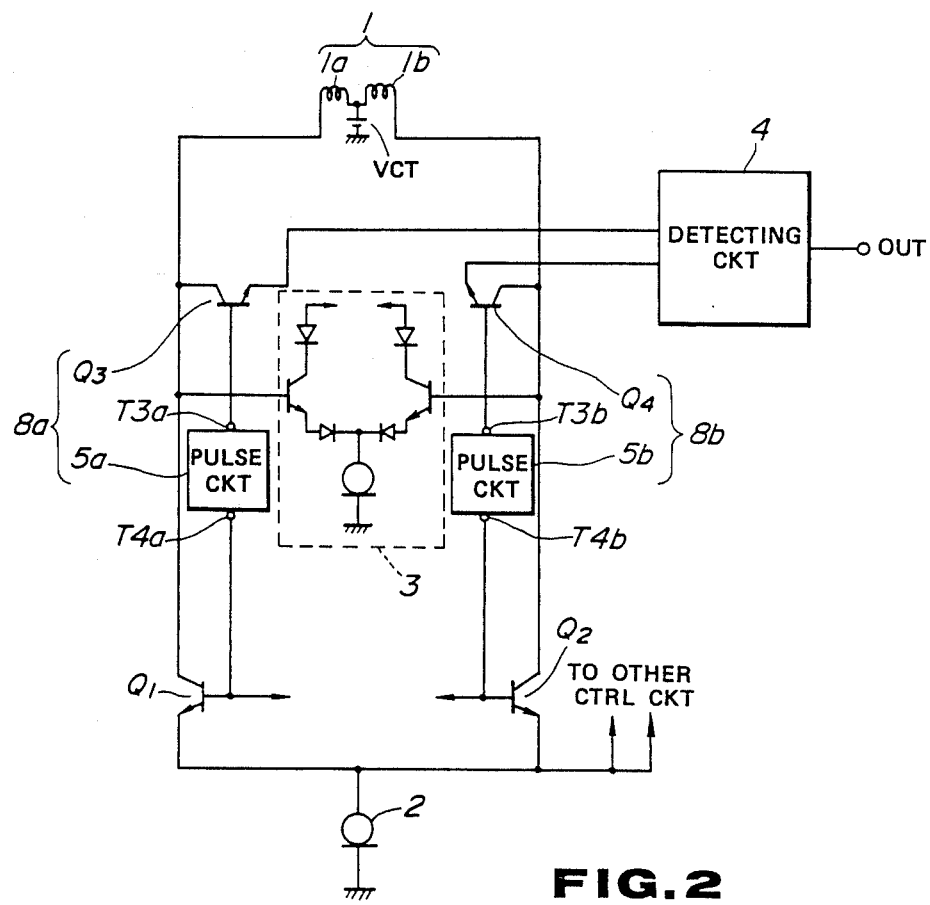
FIG. 2 is a circuit diagram showing a first embodiment of the present invention.
Figure 3:
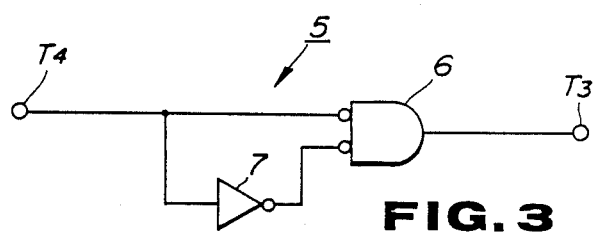
FIGS. 3 and 5 are circuit diagrams each showing a detailed construction of a main part of the first embodiment shown in FIG. 2.

First, description will be given with respect to an electrical constitution of a first embodiment in conjunction with FIGS. 2 and 3.

In the first embodiment, the detecting circuit 4 may comprise a charging circuit and an amplifier as shown in the Japanese Patent Laid-Open Publication No. 62-38505. The detecting circuit 4 provides terminals for inputting the back electromotive voltage, and such terminals are connected to respective emitters of transistors Q3 and Q4. Collectors of these transistors Q3 and Q4 are connected to the coils 1a and 1b of the magnetic head 1 respectively, and bases of these transistors Q3 and Q4 are connected to output terminals T3a and T3b of pulse circuits 5a and 5b respectively. On the other hand, input terminals T4a and T4b of the pulse circuits 5a and 5b are respectively connected to the bases of the transistors Q1 and Q2. Each of these pulse circuits 5a and 5b is constituted as shown in FIG. 3. The input terminal T4 (representative of T4a and T4b) of the pulse circuit 5 (representative of 5a and 5b) is connected to a first inversion input terminal of an AND circuit 6 and an input terminal of an inverter 7. The output terminal of the inverter 7 is connected to a second inversion input terminal of the AND circuit 6, and the output terminal of the AND circuit 6 is connected to the output terminal T3 (representative of T3a and T3b). Therefore, when the level of the signal supplied to the input terminal T4 is turned from "H" level to "L" level, the pulse circuit 5 outputs a pulse signal having a short "H" level period during a time-delay period due to the inverter 7. In other words, the pulse circuit 5 outputs such pulse signal having a predetermined pulse width just after the down edge of the write pulse at a time when each of the transistors Q1 and Q2 is turned from ON to OFF. Due to such pulse signals outputted from the pulse circuits 5a and 5b, the transistors Q3 and Q4 are respectively turned ON so that the back electromotive voltage produced at the coils 1a and 1b will be inputted to the detecting circuit 4. Thus, the pulse circuit 5a and the transistor Q3 constitute a synchronizing circuit 8a, and similarly, the pulse circuit 5b and the transistor Q4 constitute a synchronizing circuit 8b. These synchronizing circuits 8a and 8b synchronize a detection timing of the detecting circuit 4 with that of the write pulse.

Figure 4:
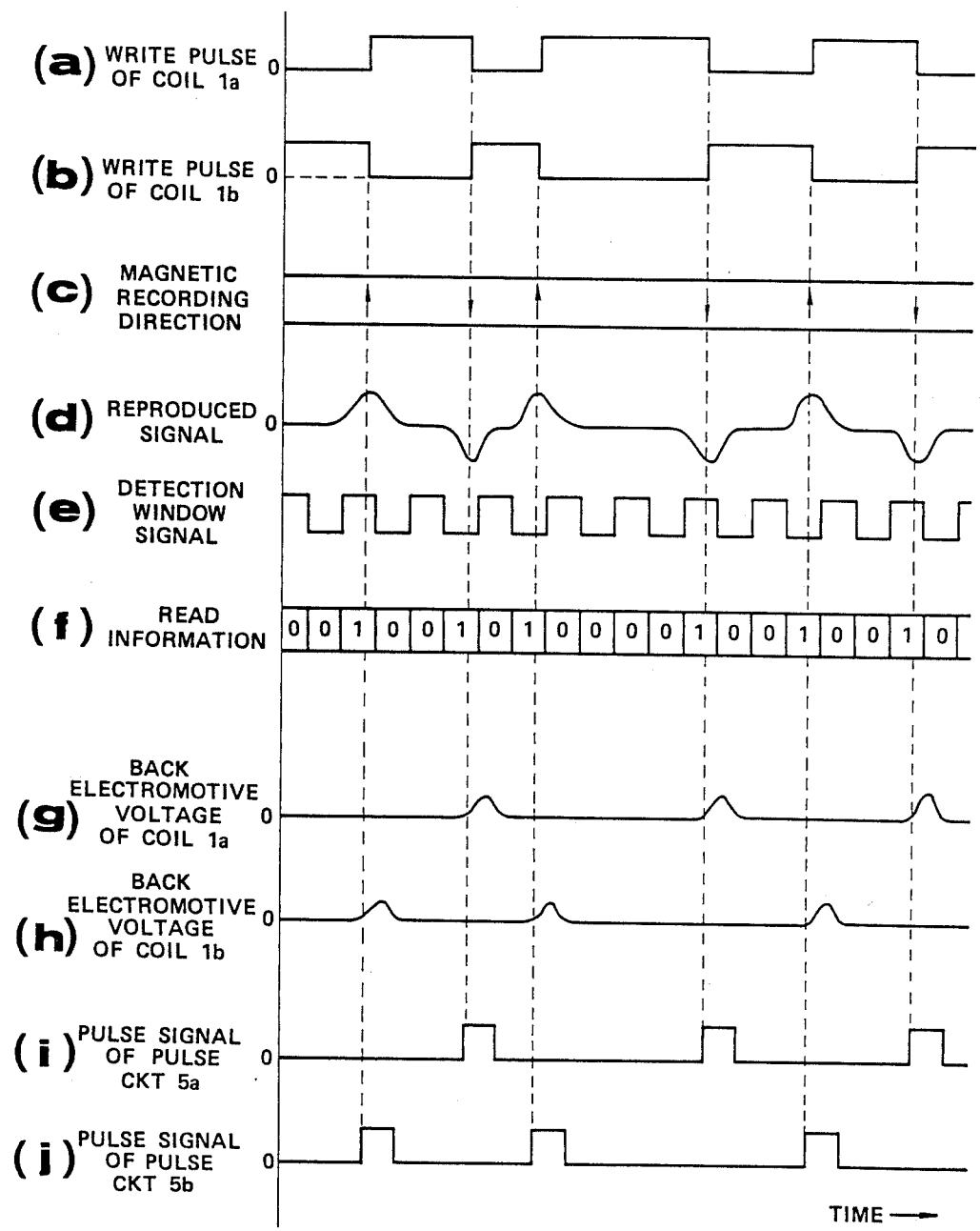
FIG. 4 is a time chart for explaining an operation of the first embodiment.

Next, description will be given with respect to an operation of the first embodiment in conjunction with FIG. 4.

As similar to the conventional device described before in FIG. 1, the write signals are supplied to the bases of the transistors Q1 and Q2. The levels of these write signals are set inverted (complementary) each other so that the first transistor Q1 will be turned ON when the second transistor Q2 will be turned OFF. As a result, the coils 1a and 1b are supplied with write pulses as shown in FIGS. 4(a) and 4(b) so that a magnetic recording direction will be changed as shown in FIG. 4(c). Thus, the magnetic head 1 can record the information corresponding to the write signals on the magnetic recording medium. Thereafter, such information will be reproduced as a signal shown in FIG. 4(d). By corresponding this reproduced signal with a detection window signal shown in FIG. 4(e), this reproduced signal can be read as information as shown in FIG. 4(f).

When recording information, back electromotive voltage as shown in FIG. 4(g) is produced at the coil 1a, while back electromotive voltage as shown in FIG. 4(h) is produced at the coil 1b. As similar to the conventional device, these back electromotive voltages are respectively produced just after the down edges of the write pulses. Therefore, the pulse circuits 5a and 5b respectively output the pulse signals each having the predetermined pulse width, and each level of these pulse signals is turned up to the "H" level just after the down edge of each write pulse as shown in FIGS. 4(i) and 4(j). When each of these pulse signals are inputted to each of the transistors Q3 and Q4, the transistor Q3 or Q4 is turned ON. Hence, the coil 1a (or 1b) is connected to the detecting circuit 4 via the coil Q3 (or Q4) during a short ON period of the transistor Q3 (or Q4), i.e., while the back electromotive voltage is produced at the coil 1a (or 1b).

Thus, only when the back electromotive voltage is produced, the detecting circuit 4 must be connected to the coil 1a (or 1b) so that the detecting circuit 4 can input the back electromotive voltage. On the contrary, when the back electromotive voltage to be produced is not produced at the coil, the main body 4 outputs the detection signal. As described heretofore, the detecting circuit 4 can input the back electromotive voltage without being effected by the noise, so that it becomes possible to detect whether the back electromotive voltage is produced at the coil or not with accuracy.

Figure 5:
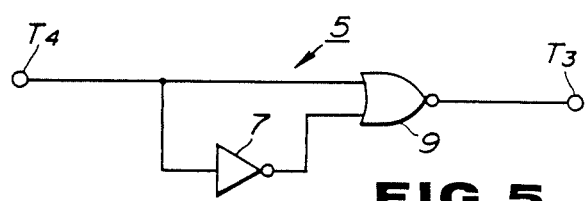

FIG. 5 is a circuit diagram showing a modified embodiment of the pulse circuit 5. In FIG. 5, a NOR circuit 9 is connected with the inverter 7, instead of the AND circuit 6 shown in FIG. 3 described before. However, the operation of this pulse circuit 5 shown in FIG. 5 is identical to that of the pulse circuit 5 shown in FIG. 3, hence, description thereof will be omitted.

Figure 6:
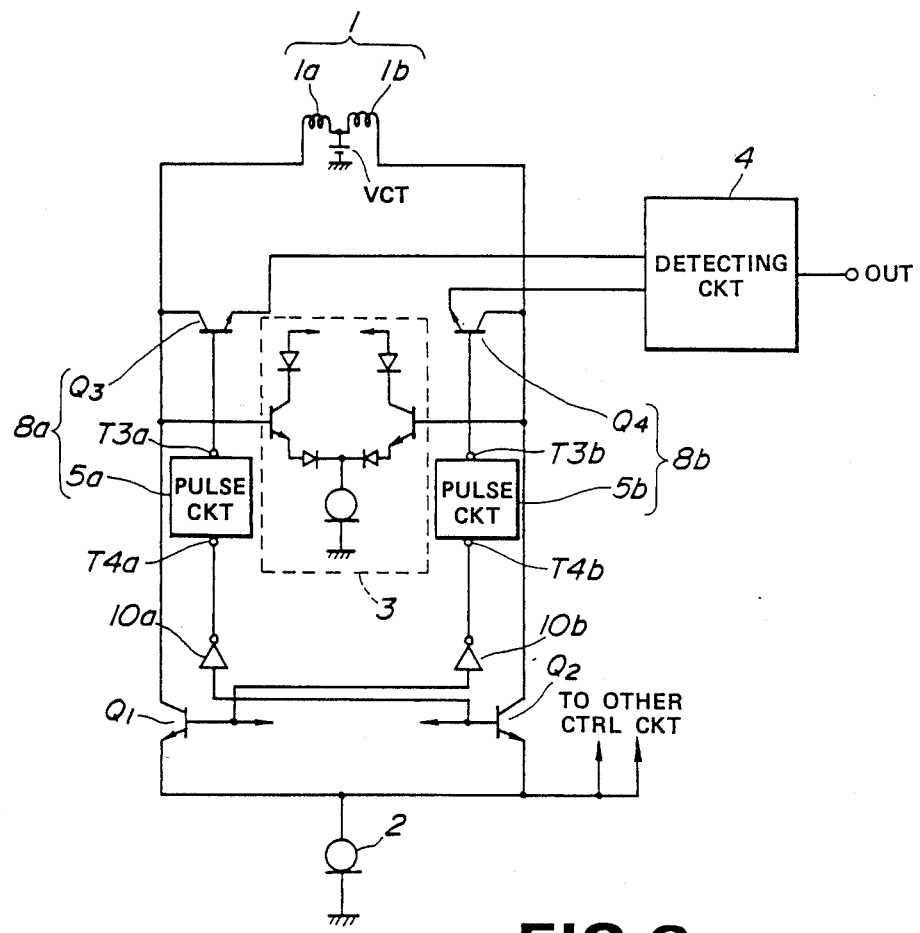
FIG. 6 is a circuit diagram showing a second embodiment of the present invention.

FIG. 6 is a circuit diagram showing a second embodiment of the present invention.

In this second embodiment, the base of the transistor Q1 is connected to the input terminal T4b of the pulse circuit 5b via an inverter 10b, while the base of the transistor Q2 is connected to the input terminal T4a of the pulse circuit 5a via an inverter 10a. The operation principle of this second embodiment is similar to that of the first embodiment, hence, description thereof will be omitted.

As described heretofore, the present invention provides the synchronizing circuit by which the detection timing of the back electromotive voltage is synchronized with the switching timing of the write switching current. Hence, the present invention can input the back electromotive voltage only, regardless of the noise. For this reason, even when the back electromotive voltage is lowered to the noise level, the present invention can detect the defects (or abnormalities) of the magnetic head with accuracy.

Finally, the present invention may be practiced or embodied in still other ways without departing from the spirit or essential character thereof. Therefore, the preferred embodiments described herein are illustrative and not restrictive, the scope of the invention being indicated by the appended claims, and all variations which come within the meaning of the claims are intended to be embraced therein.

What is claimed is:

1. In a circuit for detecting a defect of a magnetic recording head having at least one coil which is driven during recording by a switching circuit which is driven by a write current pulse having a leading edge and a trailing edge, and wherein a back electromotive voltage is produced at the coil of the magnetic recording head following said trailing edge of the write current pulse, and a detecting circuit coupled to the coil for detecting the back electromotive voltage as an indication of the quality of the magnetic recording head based on the level of the back electromotive voltage produced by the coil, the improvement comprising a synchronizing circuit, coupled to said detecting circuit and receiving the write current pulse as an input, for generating a synchronized enabling pulse for said detection circuit upon detection of the trailing edge of the write current pulse, to synchronize the enabled operation of said detection circuit with the generation of the back electromotive voltage.

2. A circuit according to claim 1, wherein said synchronizing circuit includes a pulse circuit, and an NPN transistor, the base of which is supplied with an output pulse signal from said pulse circuit, with the emitter of said transistor being connected to said detecting circuit, and the collector of said transistor being connected to the coil of the magnetic head.

3. A circuit according to claim 1, wherein said synchronizing circuit includes a pulse circuit producing an output pulse signal and comprising an inverter and an AND circuit having first and second inverse input terminals, with the write current pulse being supplied to said first inverse input terminal directly, while the write current pulse is supplied to said second inverse terminal through said inverter, said output pulse signal being outputted from an output terminal of said AND circuit, whereby said output pulse signal has a pulse width corresponding to a time delay period of said inverter when the level of the write current pulse is turned from a high level H to a low level L.

4. A circuit according to claim 1, wherein said synchronizing circuit includes a pulse circuit producing an output pulse signal and comprising an inverter and a NOR circuit having first and second input terminals, the write current pulse is supplied to said first input terminal directly, while the write current pulse is supplied to said second input terminal through said inverter, said output pulse signal being outputted from an output terminal of said NOR circuit, whereby said output pulse signal has a pulse width corresponding to a time delay period of said inverter when the level of the write signal is turned from a high level H to a low level L.

* * * * *